US010438874B2

(12) United States Patent
Fukase et al.

(10) Patent No.: US 10,438,874 B2
(45) Date of Patent: Oct. 8, 2019

(54) POWER CONVERSION DEVICE

(71) Applicant: Mitsubishi Electric Corporation, Tokyo (JP)

(72) Inventors: Tatsuya Fukase, Tokyo (JP); Masaki Kato, Tokyo (JP); Jun Tahara, Tokyo (JP); Tomoaki Shimano, Tokyo (JP); Saburo Tanaka, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 15/881,883

(22) Filed: Jan. 29, 2018

(65) Prior Publication Data

US 2019/0103344 A1 Apr. 4, 2019

(30) Foreign Application Priority Data

Sep. 29, 2017 (JP) .................................. 2017-190111

(51) Int. Cl.
*H01L 23/495* (2006.01)
*H02M 7/537* (2006.01)
(Continued)

(52) U.S. Cl.
CPC ........ *H01L 23/49568* (2013.01); *H01L 23/36* (2013.01); *H01L 23/49562* (2013.01);
(Continued)

(58) Field of Classification Search
CPC ... H02M 2001/007; H02M 2001/0048; H02M 1/00; H02M 7/00; B60L 11/00; H02P 21/22
(Continued)

(56) References Cited

U.S. PATENT DOCUMENTS

2011/0291236 A1* 12/2011 Hayashi ............ H01L 23/49537
257/532
2011/0310585 A1* 12/2011 Suwa ................. H05K 7/20927
361/820
(Continued)

FOREIGN PATENT DOCUMENTS

JP  2011238906 A  11/2011
JP  2016-93090 A   5/2016
(Continued)

OTHER PUBLICATIONS

Communication dated Jul. 3, 2018, from the Japanese Patent Office in counterpart application No. 2017-190111.
(Continued)

*Primary Examiner* — Jonathan Han
(74) *Attorney, Agent, or Firm* — Sughrue Mion, PLLC; Richard C. Turner

(57) ABSTRACT

To obtain a compact and high output power conversion device by achieving high heat dispersion performance and a reduction in heat generation, and enabling an efficient arrangement of power modules of three-phase circuits, four switchable power semiconductor chips of each of the power modules are arranged so that two pairs of circuits for one phase connected in series are connected in parallel to form a circuit for two phases, the lead frame includes two positive potential leads, two AC potential leads, and one negative potential lead that are separated from each other, the four switchable power semiconductor chips are individually arranged on four leads of the two positive potential leads and the two AC potential leads, the two positive potential leads each have an end portion connected to a bus bar via a welding point individually provided for each phase, and the bus bar is provided in common.

7 Claims, 4 Drawing Sheets

(51) Int. Cl.
*H02M 7/00* (2006.01)
*H01L 23/36* (2006.01)
*H02P 27/06* (2006.01)
*H01L 23/31* (2006.01)
*H02M 7/5387* (2007.01)
*H02M 1/00* (2006.01)

(52) U.S. Cl.
CPC ...... *H01L 23/49575* (2013.01); *H02M 7/003* (2013.01); *H02M 7/537* (2013.01); *H01L 23/3157* (2013.01); *H01L 2224/40245* (2013.01); *H01L 2924/181* (2013.01); *H02M 7/5387* (2013.01); *H02M 2001/008* (2013.01); *H02P 27/06* (2013.01)

(58) Field of Classification Search
USPC .................................................. 318/400.27
See application file for complete search history.

(56) References Cited

U.S. PATENT DOCUMENTS

2013/0058143 A1* 3/2013 Tachibana ............. H02M 7/003
363/131
2015/0023081 A1* 1/2015 Obiraki ................. H02M 7/003
363/131

FOREIGN PATENT DOCUMENTS

| JP | 201755585 A | 3/2017 |
| JP | 2017112792 A | 6/2017 |
| JP | 2017-127097 A | 7/2017 |

OTHER PUBLICATIONS

Communication dated Jan. 29, 2019 issued by the Japanese Patent Office in counterpart application No. 2017-190111.

* cited by examiner

[FIG. 1]
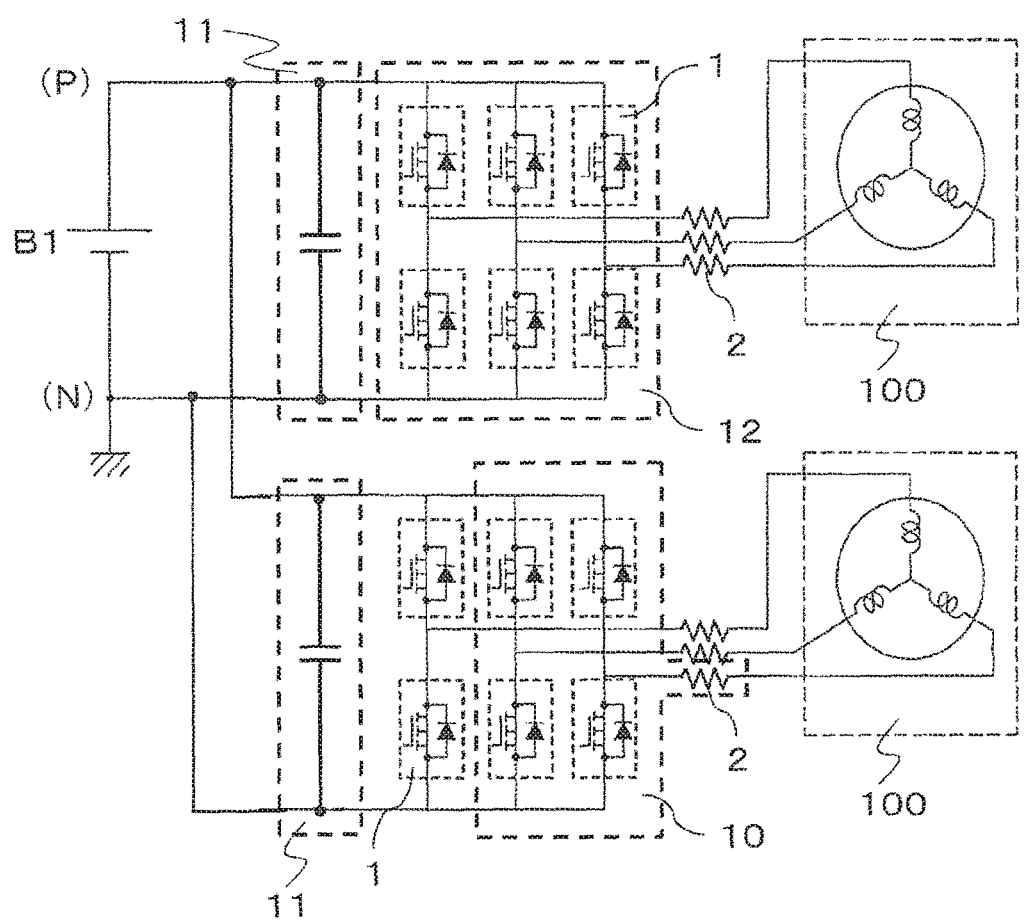

[FIG. 2]
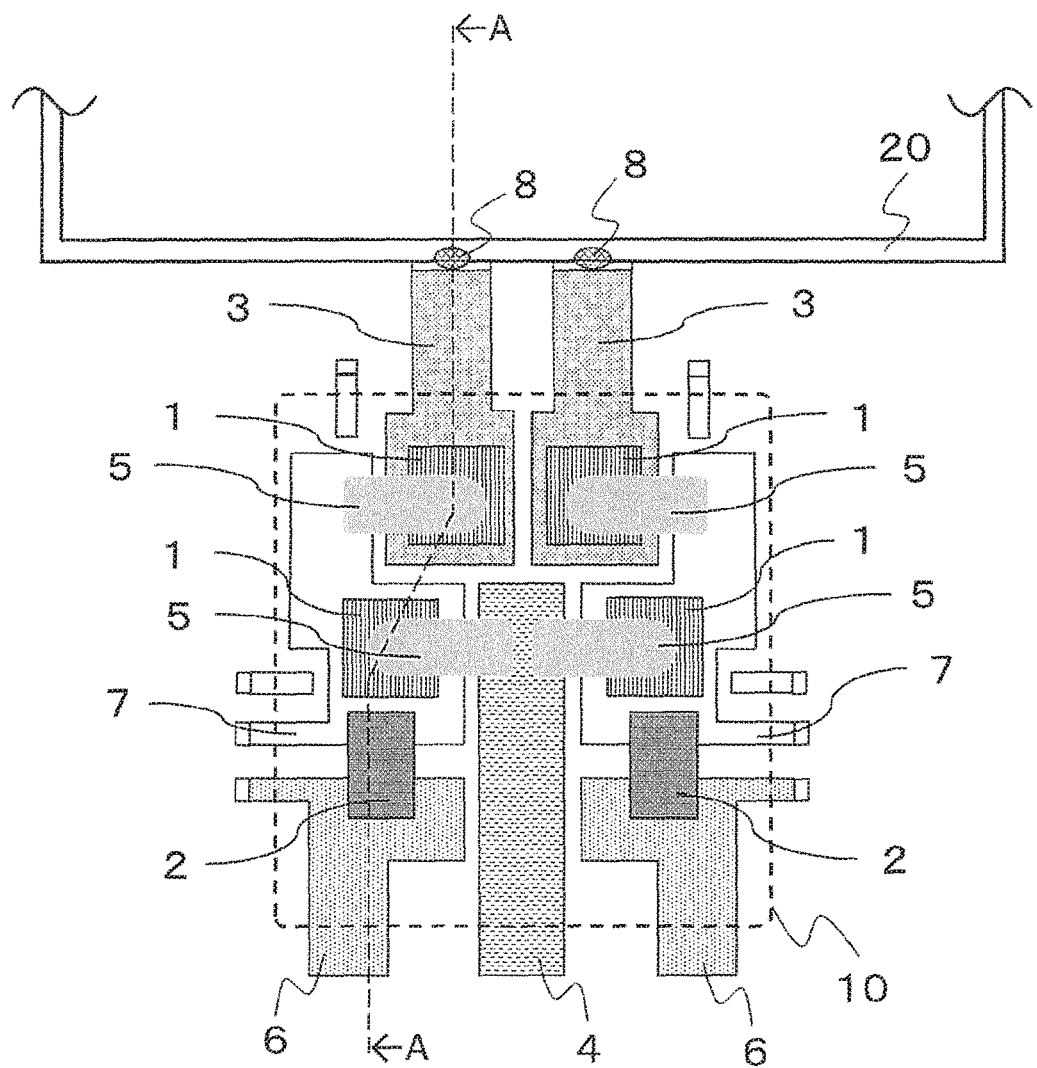

[FIG. 3]
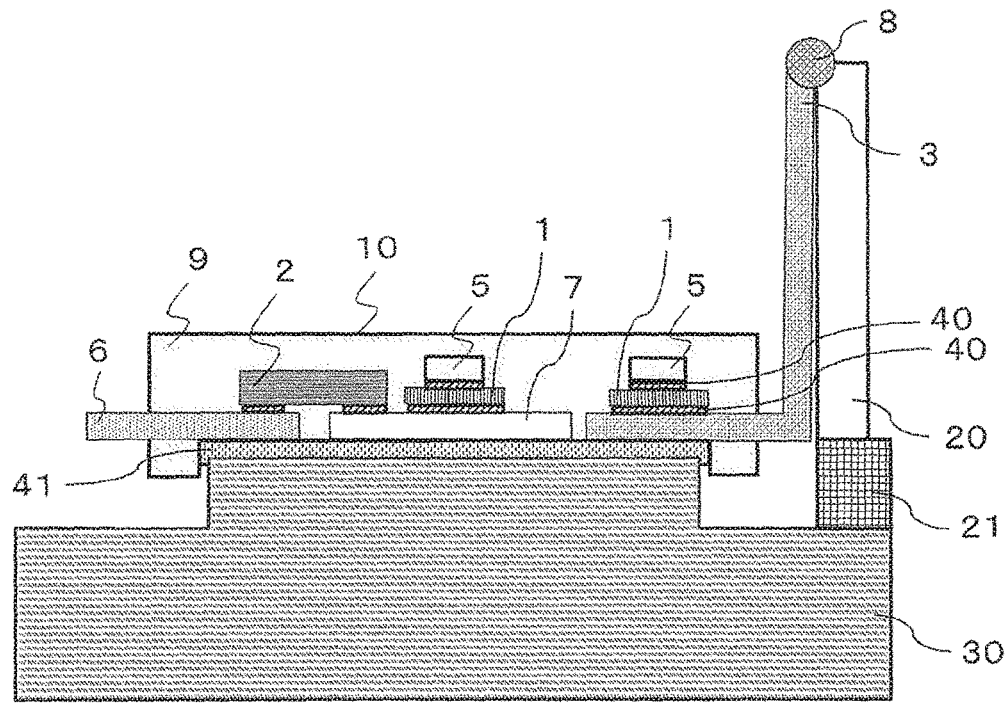
[FIG. 4]
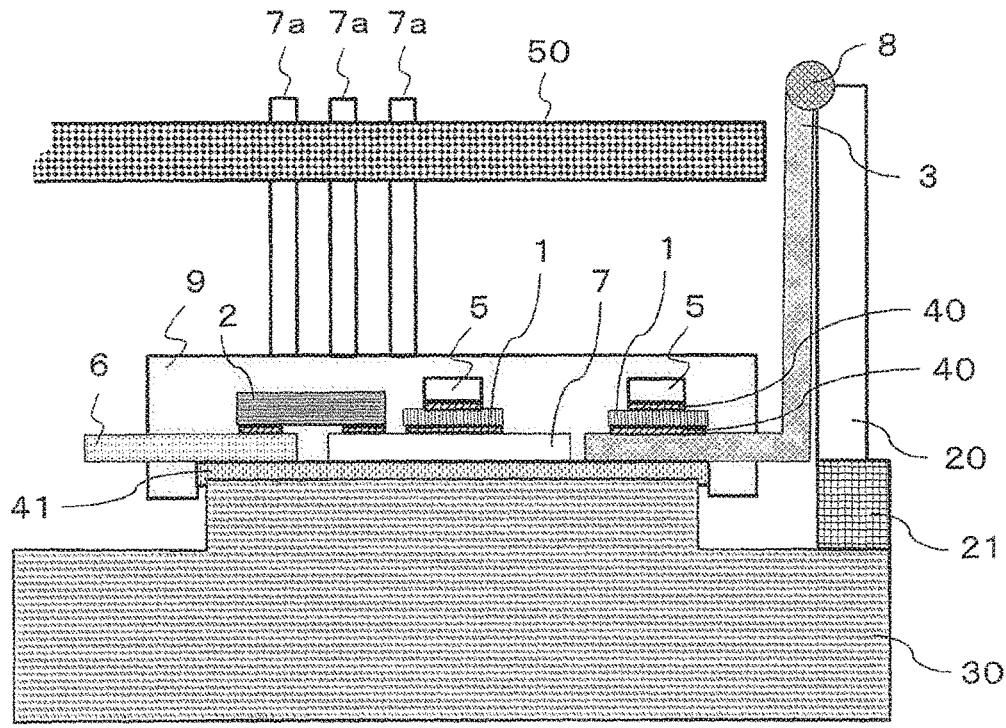

[FIG. 5]
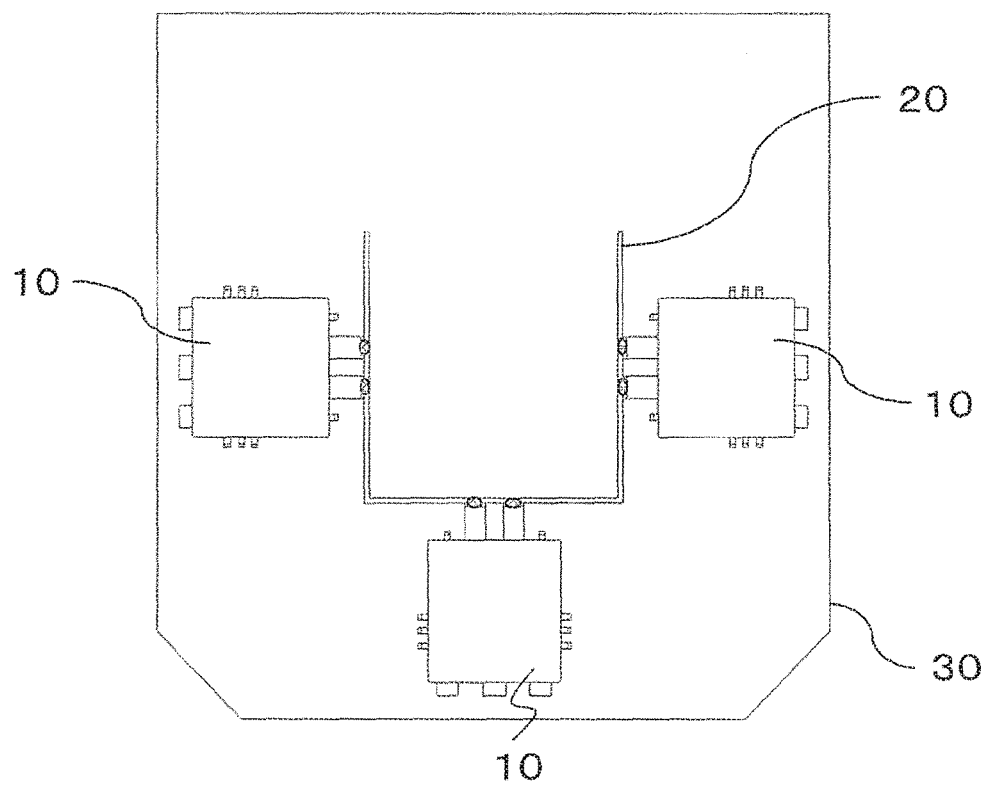

POWER CONVERSION DEVICE

BACKGROUND OF THE INVENTION

1. Field of the Invention

The present invention relates to a power conversion device including a combination of power modules into each of which switchable power semiconductor chips are built.

2. Description of the Related Art

Power conversion devices to be used for rotary electric machines are desired to achieve high heat dispersion performance and low generation loss. In particular, in terms of downsizing of the power conversion devices, how to achieve desired performance, namely, high heat dispersion performance and low generation loss, is a key.

The power conversion device includes, as its basic configuration, a combination of a power conversion circuit, a control board having mounted thereon a controller configured to control the power conversion circuit, and a smoothing capacitor for suppressing voltage fluctuations and noise. The power conversion device converts DC power supplied thereto from a power supply to desired AC power, and supplies the AC power to the rotary electric machine, to thereby control the rotary electric machine.

The power conversion circuit includes a combination of a plurality of power modules in each of which switchable power semiconductor chips are mounted. Each power module is mounted on a heat sink.

The controller on the control board transmits a control signal for switching the power semiconductor chips to the power conversion circuit, to thereby turn on and off the power semiconductor chips to control electric power. The smoothing capacitor plays a role in absorbing voltage fluctuations and noise that are generated during electric power control.

The components such as the power supply, the power modules, and the smoothing capacitor are connected to a metal plate called "bus bar". When the power conversion circuit is in operation, electric power is transmitted between the components via the bus bar.

The power conversion circuit for controlling the three-phase rotary electric machine includes a three-phase circuit. In the power conversion circuit, two three-phase circuits are connected in parallel with use of the bus bar so that electromagnetic noise can be reduced and a fluctuation in driving torque can be smoothed when the rotary electric machine is operated.

The power module is constructed as follows: the power semiconductor chips are mounted on a lead frame formed into a wiring pattern shape, the upper surface electrode pads of the power semiconductor chips are connected by wiring members, and the resultant is encapsulated with a mold resin.

The power semiconductor chip, which is mounted on the power module, generates heat when being supplied with current to raise its temperature. An allowable temperature is set to the power semiconductor chip, and it is required to appropriately control current that is supplied to the power semiconductor chip so that the temperature of the power semiconductor chip does not exceed the allowable temperature.

When being supplied with current, the power semiconductor chip is required to be controlled so that its temperature does not exceed the allowable temperature, even when the power semiconductor chip is controlled to supply the maximum output. This means that when the maximum electric power of the power conversion device is to be improved, the power semiconductor chip is required to be controlled so that its temperature is always maintained within the allowable range.

In order to utilize the power semiconductor chip with the maximum electric power, it is required to achieve, for example, a reduction in heat generation loss, a reduction in amount of heat that the power semiconductor chip receives from its outside, and a facilitation of heat dispersion, with respect to input of the same electric power. In addition, it is also required to monitor the temperature of the power semiconductor chip, and allow input of electric power until the temperature reaches the limit of the allowable temperature, in order to enhance the maximum electric power of the power conversion device.

In the power conversion device, as described above, current is supplied via the various members such as the bus bar, the lead frame, and the power semiconductor chips, and connection portions, for example, welding portions of those members. In order to achieve a highly efficient power conversion device, it is also required to reduce a loss due to such a current supply path as much as possible.

To meet the demands described above, various power conversion devices have hitherto been proposed. For example, there has been known a related-art controller-integrated rotary electric machine in which two three-phase circuits for electric power conversion are mounted in parallel (for example, see Japanese Patent Application Laid-open No. 2017-127097).

A power conversion circuit described in Japanese Patent Application Laid-open No. 2017-127097 has a configuration in which three power modules into each of which a circuit for two phases is built are arranged so as to surround the rotary shaft of a motor and have mounting surfaces parallel to the axial direction of the motor. In addition, the power conversion circuit described in Japanese Patent Application Laid-open No. 2017-127097 has a configuration in which air is caused to flow to a heat sink arranged on the back side of the mounting surfaces so that heat generated by power semiconductor chips is efficiently discharged to outside the power modules. Further, connection portions between the power modules also serve as current paths. As a result, in the power conversion circuit described in Japanese Patent Application Laid-open No. 2017-127097, the number of components can be made small compared to a case in which individual members are arranged.

The related art, however, has the following problems. In the controller-integrated rotary electric machine described in Japanese Patent Application Laid-open No. 2017-127097, which is described above, inside the power module into which the circuit for the two phases is built, heat generated by the power semiconductor chips are transferred between the power semiconductor chips. The power semiconductor chips are consequently affected by heat generated by adjacent chips in addition to heat generated by themselves, resulting in a temperature rise of the power module.

In addition, the bus bar that functions as a current supply path for supplying current to an input side of the power conversion circuit is divided for each power module. As a result, heat generation loss at connection portions of the bus bar is large. Large heat generation loss at the connection portions leads to deterioration of electric power conversion efficiency. In addition, heat generated due to heat generation loss is transferred to the power semiconductor chips to cause a large temperature rise of the power module.

In order to prevent the temperature of the power semiconductor chip from rising to a temperature exceeding the allowable range, it is effective to limit electric power input to the power semiconductor chips. The output of the controller-integrated rotary electric machine, however, drops as a result of limiting the input electric power.

Further, in the controller-integrated rotary electric machine described in Japanese Patent Application Laid-open No. 2017-127097, the power modules are arranged in parallel to the axial direction. Thus, the size of the machine is also increased in the axial direction of the motor.

SUMMARY OF THE INVENTION

The present invention has been made in order to solve the problems described above, and has an object to provide a compact and high output power conversion device in which two three-phase circuits for electric power conversion are electrically mounted in parallel, by achieving high heat dispersion performance and a reduction in heat generation, and enabling an efficient arrangement of power modules of the three-phase circuits.

According to one embodiment of the present invention, there is provided a power conversion device including two three-phase circuits for electric power conversion in parallel, the two three-phase circuits including a combination of three power modules each including: four switchable power semiconductor chips; and a lead frame on which the four switchable power semiconductor chips are mounted, the four switchable power semiconductor chips of each of the three power modules being arranged so that two pairs of circuits for one phase connected in series are connected in parallel to form a circuit for two phases, the lead frame including two positive potential leads, two AC potential leads, and one negative potential lead that are separated from each other, the four switchable power semiconductor chips being individually arranged on four leads of the two positive potential leads and the two AC potential leads, the two positive potential leads each having an end portion connected to a bus bar via a welding point individually provided for each phase, the bus bar being provided in common between the three power modules.

According to the present invention, the power conversion device in which the two three-phase circuits for electric power conversion are electrically mounted in parallel has the configuration described below when using one power module that has mounted thereon the four power semiconductor chips forming the circuit for the two phases. Specifically, the two positive potential leads and the two AC potential leads are separately provided for the respective phases so that the four power semiconductor chips are individually arranged, and the two positive potential leads are connected to the bus bar via the individual welding points. As a result, high heat dispersion performance and a reduction in heat generation are achieved, and an efficient arrangement of the power modules of the three-phase circuits is enabled. A compact and high output power conversion device can therefore be obtained.

BRIEF DESCRIPTION OF THE DRAWINGS

FIG. 1 is a diagram for illustrating a power conversion circuit of a power conversion device according to a first embodiment of the present invention.

FIG. 2 is a view for illustrating a mounting configuration of elements of a power module of the power conversion device according to the first embodiment of the present invention.

FIG. 3 is a view for illustrating a cross section taken along the line A-A of the mounting configuration of the power module of the power conversion device according to the first embodiment of the present invention, FIG. 4 is a view for illustrating a cross section taken along the line A-A of a mounting configuration of a power conversion device according to a second embodiment of the present invention in which a control board is added to the configuration of FIG. 3.

FIG. 5 is a view for illustrating an arrangement and connection between a bus bar and power modules in the power conversion device according to the second embodiment of the present invention.

DESCRIPTION OF THE EMBODIMENTS

Referring to the accompanying drawings, a power conversion device according to preferred embodiments of the present invention is described below.

First Embodiment

FIG. 1 is a diagram for illustrating a power conversion circuit of a power conversion device according to a first embodiment of the present invention. The power conversion circuit of the first embodiment includes P-N capacitors 11 and three-phase circuits 12.

The P-N capacitor 11 is connected between a pair of input terminals (P) and (N). The P-N capacitor 11 is electrically connected to the three-phase circuit 12 in parallel, between the pair of input terminals (P) and (N). Further, output from the three-phase circuit 12 is transmitted to a rotary electric machine 100 via current detection resistors 2.

In the power conversion circuit of FIG. 1, the two three-phase circuits 12 are connected in parallel with respect to a power supply B1, and individually control the respective rotary electric machines 100. A power module 10, which is configured to operate as an inverter circuit, corresponds to the two phases of the three-phase circuit 12. That is, as exemplified in FIG. 1, the power module 10 includes two pairs of power semiconductor chips 1 connected in series, namely, the four power semiconductor chips 1.

The power semiconductor chip 1 of the two power semiconductor chips 1 connected in series that is connected to a positive (P) terminal of the power supply B1, which is connected between the pair of input terminals (P) and (N), corresponds to a high potential-side switching element. Meanwhile, the power semiconductor chip 1 of the two power semiconductor chips 1 connected in series that is connected to a negative (N) terminal of the power supply B1, which is connected between the pair of input terminals (P) and (N), corresponds to a low potential-side switching element.

FIG. 2 is a view for illustrating a mounting configuration of elements of one power module of the power conversion device according to the first embodiment of the present invention. Further, FIG. 3 is a view for illustrating a cross section taken along the line A-A of the mounting configuration of the one power module of the power conversion device according to the first embodiment of the present invention, which is illustrated in FIG. 2.

As illustrated in FIG. 2 and FIG. 3, the power module 10 includes a metal lead frame, the power semiconductor chips 1, the current detection resistors 2, wiring members 5, coupling members 40, and a mold resin 9. In addition, the power module 10 is arranged on a heat sink 30 via an insulating member 41, and is connected to a bus bar 20 at welding points 8. A power conversion circuit is constructed as a result.

The metal lead frame is formed into a wiring pattern shape in advance. Specifically, the lead frame includes positive potential leads 3 and AC potential leads 6 on which the power semiconductor chips 1 are mounted, and a negative potential lead 4. The positive potential leads 3 and the AC potential leads 6 each include an electrode that is connected to a chip upper surface electrode of the power semiconductor chip 1 via the wiring member 5, and an electrode that is connected to a chip lower surface electrode of the power semiconductor chip 1 via the conductive coupling member 40.

As illustrated in FIG. 3, when the current detection resistors 2 are built into the power module 10, the AC potential lead 6 is divided into the AC potential lead 6 and a signal terminal 7. The power semiconductor chip is mounted on the signal terminal 7, and the current detection resistor 2 is mounted between the AC potential lead 6 and the signal terminal 7.

As illustrated in FIG. 2, the power module 10 includes the two positive potential leads 3, the two AC potential leads 6, and the two signal terminals 7 that are separately provided for the respective phases and protrude from the mold resin 9. Further, the positive potential lead for each phase can be independently connected to the bus bar 20.

The lead frame is made of metal, for example, an alloy containing copper or aluminum as its base material. The metal lead frame is obtained by subjecting a plate-like material to etching or press processing, for example, to have a wiring pattern shape. As the lead frame, any of a member having a surface on which metal being a base material of the member is exposed and a member partially subjected to plating can be used.

On the mounting surface side of the lead frame, the power semiconductor chips 1, the current detection resistors 2, the conductive coupling members 40, the wiring members 5, and other components are mounted, and the lead frame is encapsulated with the mold resin 9. From the lead frame after being encapsulated with the mold resin 9, portions that are not necessary for electric wiring are removed. As a result, the power conversion circuit in which the components for the two phases are modularized. The negative potential lead 4, which is provided in common for the two phases, and the positive potential leads 3, the AC potential leads 6, and the signal terminals 7, which are individually provided for the respective two phases, of the lead frame protrude from the side surfaces of the mold resin 9 to be connected to an external conductive wire. As a result, the power module 10 constructs the power conversion circuit for the two phases.

The power semiconductor chip 1 includes, on its chip upper surface and chip lower surface, the upper surface electrode and the lower surface electrode, respectively. The upper surface electrode is electrically and mechanically connected to the lead frame by the wiring member 5. Further, the lower surface electrode is electrically and mechanically connected to the lead frame by the conductive coupling member 40. Because of such a connection configuration, when the power semiconductor chip 1 is in operation, current flows through the power semiconductor chip 1 in a thickness direction of the power semiconductor chip 1.

In the circuit diagram of FIG. 1 referred to above, a case in which the power semiconductor chip 1 is a MOSFET is illustrated, but a switchable element, for example, an IGBT, can be applied as the power semiconductor chip 1. As a material of the power semiconductor chip 1, not only Si but also a compound semiconductor, for example, SiC, GaN, or GaAs, can be used. Further, a nickel plating layer may be formed on the upper surface electrode of the power semiconductor chip 1 to enable solder coupling, in consideration of the use of the wiring members 5, for example, inner leads.

The mold resin 9 encapsulates the mounting surface of the lead frame so as to include the metal lead frame, the power semiconductor chips 1, the current detection resistors 2, the conductive coupling members 40, and the wiring members 5. In short, the mold resin 9 is formed after the above-mentioned components are mounted on the lead frame.

As illustrated in FIG. 1, the rotary electric machine 100 is driven when being applied with output voltage that is generated through switching operation of the power semiconductor chips 1, which are built into the power module 10. According to this configuration, large current flows to the welding points 8 between the bus bar 20 on the positive terminal side and the positive potential leads 3, which are illustrated in FIG. 2. Consequently, in the power module 10 in which the two pairs of the power semiconductor chips 1 are mounted, troubles due to heat generation are liable to occur.

As illustrated in FIG. 2, in the power module 10 of the first embodiment, the positive potential leads 3, on which the power semiconductor chips 1 are mounted, are separately provided for the respective phases, and each of the two positive potential leads 3 is independently connected to the bus bar 20 at the welding, point 8 by welding. According to this configuration, the welding points 8 between the positive potential leads 3 and the bus bar 20 can be distributed to two locations in one power module.

In short, the positive potential lead 3 and the bus bar 20 are welded to each other for each phase. Thus, a current that flows to each of the welding points 8 is only a current for one phase branched from the bus bar 20. As a result, heat generation at the welding points 8 between the bus bar 20 and the positive potential leads 3, and at the positive potential leads 3 themselves can be suppressed.

In particular, the welding points 8 preferably have a large cross-sectional area because large current flows to the welding points 8. When the welding points 8 having a large cross-sectional area are to be formed, however, time that is taken for welding or energy necessary for melting the metal is increased for one welding point 8. This may result in a problem in that the welding point 8 has an unstable shape or members around the welding point 8 are melted.

In contrast to this, in the configuration of the first embodiment in which the two welding points 8 are individually provided, welding time and necessary energy for one welding point 8 can be reduced compared to the case in which one common welding point is used. In short, with the two welding points being individually provided, large current can be caused to flow as in a case in which a common welding point has a large cross-sectional area.

Further, the welding point 8 for each phase can be provided at any location. As a result, a distance between the welding points 8 can be set to any value. Thus, the temperature of the welding points 8 can be prevented from being increased by appropriately setting the distance between the two welding points 8 so that heat generated at one welding point 8 does not interfere with heat generated at another welding point 8.

In addition, a temperature change of the welding points 8 themselves can be reduced by appropriately setting the distance between the two welding points 8. Thus, the progress of deterioration of the welding points 8, which is caused due to, for example, miniaturization of metal crystal grains, can be slowed. That is, with the configuration of the welding points 8 of the first embodiment, the progress of deterioration phenomenon described above can be slowed, and long-term reliability can thus be improved. As a result, in the power conversion device according to the first embodiment, the necessity of additional members for achieving long-term reliability is eliminated.

In addition, the leads on which the power semiconductor chips 1 are mounted are separately provided for the respective phases. This means that heat generated by the power semiconductor chips 1 being driven is not transferred between the power semiconductor chips 1 via a common lead. That is, the separately provided leads are effective means for suppressing a temperature rise of the power semiconductor chips 1, and as a result, a high output power conversion device can be achieved. Further, the two three-phase circuits are mounted in parallel, and hence electromagnetic noise and a fluctuation in drive torque can be reduced when the rotary electric machine 100 is driven, as in the related art.

As illustrated in FIG. 3, the power module 10 of the first embodiment is a mold encapsulation power module in which each lead and the mounted components are encapsulated with the mold resin 9. Thus, in the power module 10 of the first embodiment, on a surface of the power module 10 that is opposite to the heat sink 30, the positive potential leads 3, the AC potential leads 6, and the negative potential lead 4 are partially exposed. Further, in the power module 10, the side surfaces of the two positive potential leads 3, the side surfaces of the two AC potential leads 6, and the side surfaces of the one negative potential lead 4 that face the corresponding side surfaces are covered with the mold resin 9.

In addition, each lead is mechanically connected to the heat sink 30 by an adhesive being the insulating member 41 containing an insulating filler. With this configuration, in the power conversion device according to the first embodiment, heat generated by the power semiconductor chips 1 during current supply can be prevented from being transferred to the adjacent leads by the mold resin 9.

In addition, in the power conversion device according to the first embodiment, with the use of the adhesive being the insulating member 41 that contains the insulating filler and has a heat conductivity that is higher than that of the mold resin 9, heat generated by the power semiconductor chips 1 can be efficiently transferred to the heat sink 30 side.

According to the configuration described above, the power module 10 can efficiently discharge heat generated by each of the power semiconductor chips 1 to outside the module while preventing the heat from being transferred between the power semiconductor chips 1 inside the module. As a result, a temperature rise of the plurality of power semiconductor chips 1 in the power module 10 can be suppressed.

In the first embodiment, a case in which inner leads are used as the wiring members 5 on the power semiconductor chips 1 is assumed. The connection between the upper surface electrodes of the power semiconductor chips 1 and the inner leads, the connection between the inner leads and the lead frame, and the connection between the lower surface electrodes of the power semiconductor chips 1 and the lead frame can be made by solder. Further, in the first embodiment, a case in which the current detection resistors 2 are mounted inside the power module 10 is assumed. This means that, according to the first embodiment, effects of the present invention can be obtained even when components such as the current detection resistors 2 are additionally arranged in the power module 10, and the AC potential leads 6 are each divided into two.

As described above, with regard to the connection between the components, the conductive coupling member 40 is arranged between each lead and the component to electrically and mechanically connect each lead and the component to each other. With solder that is used for the connection between the power semiconductor chips 1, the inner leads, the current detection resistors 2, and the lead frame, the coupling can be made through a one-time heat treatment with use of a reflow apparatus, for example. The productivity can thus be improved.

When the components are deformed due to a temperature change or other factors while the power conversion device is being used, durability vanes between locations to which solder coupling is applied. In this case, the composition of solder may be changed depending on the locations to which solder coupling is applied. In addition, in the first embodiment, as an example, the solder is described as the conductive member, but a conductive resin paste or a sintering paste may be used instead of the solder.

The wiring members connect the upper surface electrodes of the power semiconductor chips 1 and the lead frame. In the first embodiment, there is described a case in which the inner leads obtained by processing individual metal plates into the shape of the wiring member are used for connecting the upper surface electrodes of the power semiconductor chips 1 to the respective leads of the lead frame. Instead of the inner leads as described above, however, the upper surface electrodes of the power semiconductor chips 1 may be connected to the respective leads of the lead frame by a wire bond or a ribbon bond made of copper or aluminum or a clad material made of copper and aluminum.

In the case of using the inner leads, the inner leads are arranged to be in contact with the mold resin 9 except for portions to be connected to the electrodes via the conductive members. Further, the inner leads are arranged so as to be included in the mold resin 9, and do not have portions for supporting the inner leads from outside the mold resin 9 during manufacturing. The body portions of the inner leads connecting the portions to be connected to each other via the conductive members are deformed in a direction of separating more from the lead frame than end portions of the inner leads to be connected. In this manner, a short circuit between the lead frame and the inner leads can be prevented.

The cross-sectional area of the body portion of the inner lead is determined based on the amount of current to be supplied. Further, to reduce the amount of heat generated by the power semiconductor chip 1 to be transferred via the wiring member, for example, the inner lead, a through hole or a narrow portion or both of the through hole and the narrow portion can be formed in the body portion of the inner lead. In this manner, the heat resistance of the inner lead in its longitudinal direction can be increased. Thus, the amount of heat transferred between the power semiconductor chips 1 can be reduced. In the first embodiment, there is assumed a power conversion device in which a current of from about a few amperes to about a few hundred amperes, which includes a current that is instantaneously applied, is supplied.

The bus bar 20 is formed to have a sheet thickness that is 1.4 times or more as large as the sheet thickness of the positive potential lead 3. When a current of a few hundred amperes is supplied over time of at most about a few seconds, heat is generated at the welding point 8 at the end portion of the positive potential lead 3. Even in this case, with the bus bar 20 having the sheet thickness that is 1.4 times or more as large as that of the positive potential lead 3, the heat at the welding point 8 is diffused to the bus bar 20, and the amount of heat transferred to the positive potential lead 3 can be reduced.

The power semiconductor chip 1 is mounted on the positive potential lead 3. Thus, when the amount of heat transferred to the positive potential lead 3 is reduced, the amount of heat flowing into the power semiconductor chip 1 can also be reduced. As a result, a temperature rise of the power semiconductor chip 1 can be reduced. By virtue of the effects described above, a compact and high output power conversion device can be achieved even when the two three-phase circuits are constructed inside the power conversion circuit.

As described above, according to the power conversion device of the first embodiment, the power modules, which construct the two three-phase circuits, each have the configuration in which the positive potential leads on which the power semiconductor chips are mounted are separately provided for the respective phases. As a result, the two positive potential leads can be connected to the one bus bar via the individual nodes, and high heat dispersion performance and a reduction in heat generation can be achieved.

Further, with the use of the adhesive being the insulating member that contains the insulating filler and has a heat conductivity that is higher than that of the mold resin, discharging of heat from the power semiconductor chips to the heat sink side can be efficiently prompted.

In addition, with the use of the adhesive having a heat conductivity that is higher than that of the mold resin and the use of the leads separately provided for the respective power semiconductor chips, heat can be prevented from being transferred between the power semiconductor chips. In addition, by virtue of the use of those components, heat generated by the power semiconductor chips itself can be efficiently discharged to outside the power module. Consequently, a temperature rise of the power semiconductor chips can be reduced, and a compact and high output power conversion device can be achieved.

Second Embodiment

In the above-mentioned first embodiment, a method for improving the heat dispersion performance by arranging the leads in a separated manner and employing the mold resin and the insulating members is described. Meanwhile, in a second embodiment of the present invention, improvement of the heat dispersion performance and downsizing that are achieved by devising the arrangement of a control board and the arrangement of the bus bar are described.

FIG. 4 is a view for illustrating a cross section of a mounting configuration of a power conversion device according to the second embodiment in which the control board is added to the cross-sectional view of FIG. 3. A control board 50 is arranged above the three power modules 10 that construct the two three-phase circuits. In FIG. 4, however, the control board 50 arranged above one power module 10 is exemplified.

The outer dimensions of the power module 10 on the mounting plane are increased when the control board 50 is to be mounted on the same plane as the mounting plane of the power module 10. The present invention employs, however, a configuration in which the control board 50 is arranged above the power module 10 via signal leads 7a of the power module 10. As a result, the outer dimensions of the power module 10 on the mounting plane can be reduced. In this case, the signal lead 7a corresponds to the end portion of the signal terminal 7 that is exposed from the mold resin 9 and bent upward.

When the control board 50 is arranged above the power module 10, however, the welding point 8 between the bus bar 20 and the positive potential lead 3 is arranged in the vicinity of the control board 50 as illustrated in FIG. 4. Thus, it is concerned that heat generated at the welding point 8 may be transferred to the control board 50. The power conversion device of the second embodiment is configured so that, as described in the above-mentioned first embodiment, the bus bar 20 has the thickness that is 1.4 times or more as large as the thickness of the positive potential lead 3. When heat is generated at the welding point 8 connected to the bus bar 20, the heat is diffused to portions of the bus bar 20 at which the bus bar 20 does not receive the heat.

Even when current is continuously supplied for a long time, heat generated at the welding point 8 is kept being diffused to the bus bar 20. Thus, it is possible to prevent excessive heat generation at the welding point 8. That is, the control board 50 mounted above the power module 10 can suppress a temperature rise thereof due to an influence of heat generated at the welding point 8. As a result, components having low heat-resistant temperature can be arranged also near the welding point 8 above the control board 50, and an effective mounting layout can be achieved. A compact power conversion device can therefore be formed.

FIG. 5 is a view for illustrating an arrangement and a connection relationship between the bus bar 20 and each of the three power modules 10 in the power conversion device according to the second embodiment. The bus bar 20 is formed into a rectangular shape, and the power modules 10 are connected to the continuous three sides of the outer periphery of the bus bar 20 so that one power module 10 is connected to one side.

Further, although not shown, smoothing capacitors connected between the positive potential leads 3 and the negative potential lead can be mounted between the three power modules 10 mounted on the heat sink 30. In this manner, the smoothing capacitors can be arranged in a spread manner in a space between the power modules 10, which corresponds to each corner portion of the rectangular bus bar 20. As a result, a compact power conversion device can be achieved.

In the description above, the preferred embodiments are described in detail, but the present invention is not limited to the embodiments described above. Various modifications and replacement can be made to the above-mentioned embodiments without departing from the scope described in the appended claims.

What is claimed is:
1. A power conversion device, comprising:
two three-phase circuits for electric power conversion in parallel, the two three-phase circuits including a combination of three power modules each including:
four switchable power semiconductor chips; and
a lead frame on which the four switchable power semiconductor chips are mounted,
wherein the four switchable power semiconductor chips of each of the three power modules are arranged so that a first pair of the four switchable power semiconductor chips for one first phase are connected in series, a second pair of the four switchable power semiconductor chips for one second phase are connected in series, and the first pair of the four switchable power semi- conductor chips and the second pair of the four switchable power semiconductor chips are connected in parallel, wherein the lead frame includes two positive potential leads, two AC potential leads, and one negative potential lead that are separated from each other, wherein the four switchable power semiconductor chips are respectively arranged on the two positive potential leads and the two AC potential leads, wherein each of the two positive potential leads includes an end portion connected to a bus bar via a welding point that is individually provided for a respective one of the one first phase and the one second phase, and wherein the bus bar is provided in common between the three power modules.

2. The power conversion device according to claim 1, wherein each of the three power modules includes a mold encapsulation power module in which the four switchable power semiconductor chips, the two positive potential leads, the two AC potential leads, and the one negative potential lead are encapsulated with a mold resin, wherein surfaces of the two positive potential leads, surfaces of the two AC potential leads, and a surface of the one negative potential lead are covered with the mold resin, and wherein the lead frame includes, on a surface opposite to a surface on which the four switchable power semiconductor chips are mounted, a region that is prevented from being encapsulated with the mold resin, and is connected to a heat sink via an insulating member containing an insulating filler.

3. The power conversion device according to claim 2, wherein the insulating member is made of a material having a heat conductivity and a specific heat that are higher than a heat conductivity and a specific heat of the mold resin.

4. The power conversion device according to claim 1, wherein the bus bar, to which the two positive potential leads are welded, has a sheet thickness that is 1.4 times or more as large as a sheet thickness of the two positive potential leads.

5. The power conversion device according to claim 1, further comprising a control board arranged above the three power modules.

6. The power conversion device according to claim 1, wherein the bus bar has a shape forming three sides of a rectangular shape, and wherein each of the three power modules are arranged on a respective one of the three sides of an outer periphery of the bus bar.

7. The power conversion device according to claim 1, further comprising a smoothing capacitor connected between a positive potential and a negative potential of each of the three power modules, wherein the smoothing capacitor is arranged in a space between the three power modules, on a heat sink on which the three power modules are mounted.

* * * * *